(12) United States Patent
Yamaguchi et al.

(10) Patent No.: US 11,499,669 B2
(45) Date of Patent: Nov. 15, 2022

(54) SUPPORT STRUCTURE AND SUPPORT TOOL SET

(71) Applicant: TDK CORPORATION, Tokyo (JP)

(72) Inventors: Kenichi Yamaguchi, Tokyo (JP); Kouji Kaneko, Tokyo (JP); Koichi Kobayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/101,233

(22) Filed: Nov. 23, 2020

(65) Prior Publication Data

US 2021/0164608 A1 Jun. 3, 2021

(30) Foreign Application Priority Data

Nov. 29, 2019 (JP) .............................. JP2019-217177

(51) Int. Cl.
*F16M 13/02* (2006.01)
*F16B 2/24* (2006.01)

(52) U.S. Cl.
CPC ............. *F16M 13/02* (2013.01); *F16B 2/245* (2013.01)

(58) Field of Classification Search
CPC ................ F16M 13/02; F16B 2/245; H05K 2201/10409; H05K 2201/10424; H05K 3/301; H05K 2201/10598; H05K 7/2049; H05K 1/0203; H05K 1/0209; H05K 7/14
USPC ........................................................ 248/126
See application file for complete search history.

(56) References Cited

U.S. PATENT DOCUMENTS

| | | | | | |
|---|---|---|---|---|---|
| 5,853,075 | A | * | 12/1998 | Giroire | F16F 15/30 192/70.27 |
| 6,478,622 | B1 | * | 11/2002 | Hwang | H05K 9/0058 439/607.2 |
| 7,677,926 | B1 | * | 3/2010 | Huang | H01R 13/658 439/607.38 |
| 7,744,172 | B2 | * | 6/2010 | Chen | G06F 1/183 312/223.2 |
| 8,444,439 | B2 | * | 5/2013 | Cao | H01R 13/514 439/607.35 |
| 2007/0170328 | A1 | * | 7/2007 | Fortes | F16M 13/02 248/288.31 |
| 2010/0164670 | A1 | * | 7/2010 | Nakahori | H05K 1/165 336/200 |
| 2013/0072063 | A1 | * | 3/2013 | Qiao | H01R 13/6584 439/607.01 |
| 2013/0175416 | A1 | * | 7/2013 | Zhu | H01R 13/659 248/201 |
| 2018/0311795 | A1 | * | 11/2018 | Morton | B23Q 3/1546 |

FOREIGN PATENT DOCUMENTS

JP 2010-153722 A 7/2010

* cited by examiner

*Primary Examiner* — Muhammad Ijaz
(74) *Attorney, Agent, or Firm* — Oliff PLC (57) ABSTRACT

A support structure supports a component mounted on a mounting surface of a structure by pressing the component to the mounting surface side and includes a first support tool and a second support tool used so that the component is pressed to the mounting surface side and supported and a fixing portion provided on the structure and fixing the first support tool and the second support tool. The first support tool and the second support tool are fixed to the same fixing portion.

8 Claims, 4 Drawing Sheets

SUPPORT STRUCTURE AND SUPPORT TOOL SET

CROSS REFERENCE TO RELATED APPLICATIONS

This application claims priority to Japanese Patent Application No. 2019-217177 filed on Nov. 29, 2019, the entire contents of which are incorporated by reference herein.

TECHNICAL FIELD

The present disclosure relates to a support structure and a support tool set.

BACKGROUND

In the related art, a support structure that is described in Japanese Unexamined Patent Publication No. 2010-153722 is known as a support structure. This support structure supports a component mounted on the mounting surface of a structure by pressing the component to the mounting surface side with a support tool. This support structure has a plurality of the individual support tools for individually pressing a plurality of the components. It is necessary to adjust the pressing force for each component especially in a case where the plurality of components to be pressed differ in weight or shape, examples of which include a case where the height from the pressing surface to the surface receiving the pressing force differs. In this case as well, it is necessary to change the pressing force with the elastic force of the material of the support tool taken into account depending on the component to be pressed. Accordingly, the plurality of support tools are used in this structure in any case and each support tool is fixed with respect to the structure at an individual fixing point.

SUMMARY

In the support structure described above, the support tools need to be individually fixed to the structure so that the individual components are pressed. This necessity leads to an increase in labor for work, which is a problem. Conceivable in this regard is a method in which one large cover is prepared and an individual support tool is fixed in advance with respect to the cover. When this method is used and one cover is fixed to a structure, it is possible to collectively press a plurality of components. However, this method is problematic in that an increase in the weight of a support structure results from the necessity of the large cover.

An object of the present disclosure is to provide a support structure and a support tool set with which it is possible to suppress an increase in weight while improving the workability at a time of fixing a support tool.

The support structure according to the present disclosure is a support structure supporting a component mounted on a mounting surface of a structure by pressing the component to the mounting surface side, the support structure including a first support tool and a second support tool used so that the component is pressed to the mounting surface side and supported and a fixing portion provided on the structure and fixing the first support tool and the second support tool, in which the first support tool and the second support tool are fixed to the same fixing portion.

The support structure according to the present disclosure includes the first support tool and the second support tool used so that the component is pressed to the mounting surface side and supported. In addition, the first support tool and the second support tool are fixed to the same fixing portion. As a result, it is possible to collectively fix the first support tool and the second support tool with respect to the fixing portion even without increasing the weight by using, for example, a large cover different from the support tools. As a result, it is possible to suppress an increase in weight while improving the workability at a time of fixing the support tools.

A set of the first support tool and the second support tool may have a plurality of pressing portions pressing a plurality of the components. As a result, it is possible to collectively press the plurality of components by fixing the first support tool and the second support tool to the fixing portion.

At least one of the first support tool and the second support tool may have a pressing portion pressing the component and a reinforcing portion extending in a direction different from the pressing portion and enhancing strength as a support tool. As a result, the pressing force at a time when the pressing portion presses the component can be improved.

The support structure may further include a positioning protrusion provided on the structure and positioning the first support tool and the second support tool, in which the first support tool and the second support tool may respectively have positioning holes into which the same positioning protrusion is inserted. As a result, the first support tool and the second support tool can be collectively positioned.

A penetrating portion allowing confirmation of the component in a pressed state may be formed in at least one of the first support tool and the second support tool. In this case, it is possible to confirm the state of pressing of the component even in a structure in which the plurality of support tools are combined.

The first support tool and the second support tool reinforce strength at a time when the component is pressed by overlapping each other. As a result, the first support tool and the second support tool can be overlapped and collectively fixed by the fixing portion and the pressing force of the component can be improved at the same time.

The first support tool and the second support tool may be made of different materials. Even in a case where, for example, the pressing forces required for the component pressed by the first support tool and the component pressed by the second support tool are different from each other, it is possible to easily obtain a pressing portion having an elastic force corresponding to the required pressing force simply by using different materials for the first support tool and the second support tool.

A support tool set is a support tool set supporting a component mounted on a mounting surface of a structure by pressing the component to the mounting surface side, the support tool set including a first support tool and a second support tool used so that the component is pressed to the mounting surface side and supported, in which the first support tool and the second support tool have fixed structures fixed to the same fixing portion provided on the structure in a state of overlapping each other.

With the support tool set, it is possible to obtain the same actions and effects as the support structure described above.

According to the present disclosure, it is possible to provide a support structure and a support tool set with which it is possible to suppress an increase in weight while improving the workability at a time of fixing a support tool.

DETAILED DESCRIPTION

Figure 1:
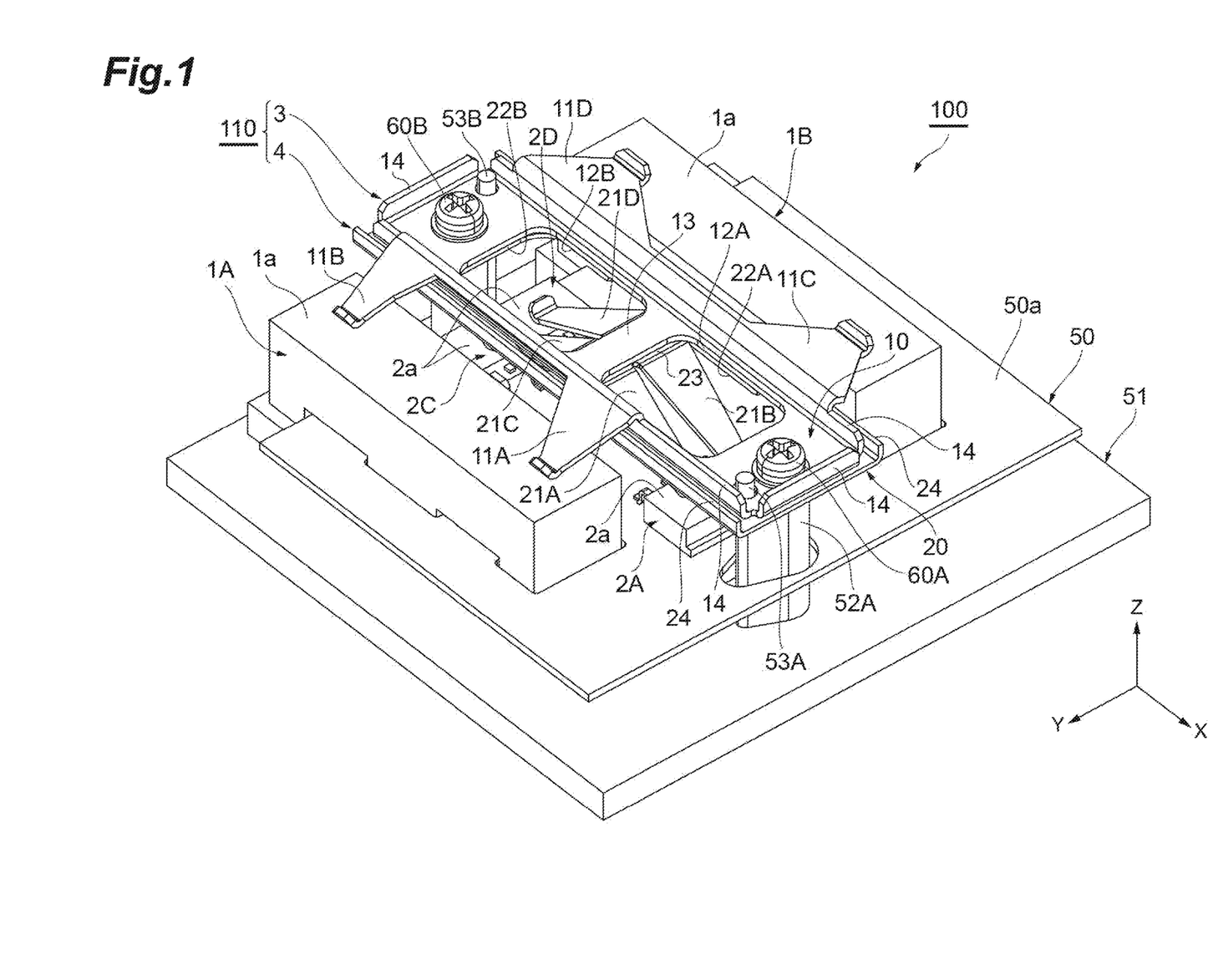
FIG. 1 is a perspective view illustrating a support structure according to an embodiment of the present disclosure.
Figure 2:
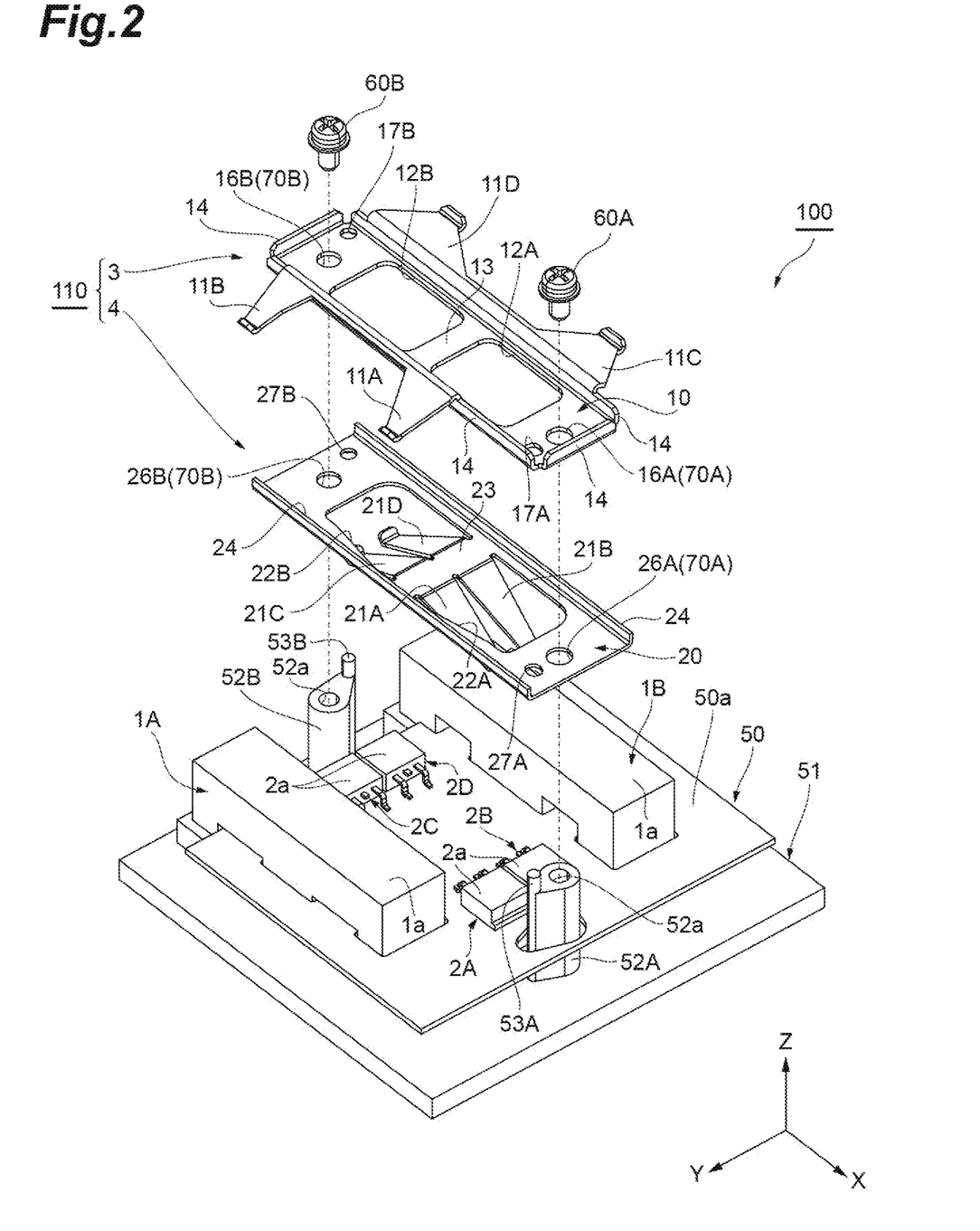
FIG. 2 is a developed perspective view of the support structure of FIG. 1.

A support structure according to an embodiment of the present disclosure will be described with reference to FIGS. 1 and 2. FIG. 1 is a perspective view illustrating a support structure 100 according to the embodiment of the present disclosure. FIG. 2 is a developed perspective view of the support structure illustrated in FIG. 1.

As illustrated in FIGS. 1 and 2, the support structure 100 is a structure that supports components 1A, 1B, 2A, 2B, 2C, and 2D mounted on a mounting surface 50a of a substrate 50 (structure) by pressing the components 1A, 1B, 2A, 2B, 2C, and 2D with a support tool set 110. The support tool set 110 includes a first support tool 3 and a second support tool 4. The mounting surface 50a spreads out in a planar shape on one side of the substrate 50. It should be noted that the X axis is set in the direction that is parallel to the mounting surface 50a, the Y axis is set in the direction that is parallel to the mounting surface 50a and orthogonal to the X-axis direction, and the Z axis is set in the direction that is orthogonal to the X axis and the Y axis. The direction from the inside of the substrate 50 toward the mounting surface 50a is the positive side in the Z-axis direction.

The components 1A, 1B, 2A, 2B, 2C, and 2D are mounted on the mounting surface 50a of the substrate 50. Here, rectangular parallelepiped components having a longitudinal direction in the X-axis direction are adopted as the components 1A and 1B. The components 1A and 1B are disposed so as to be separated from each other in the Y-axis direction. The components 1A and 1B have an upper surface 1a spreading out in parallel to the XY plane at a position separated from the mounting surface 50a on the positive side in the Z-axis direction. The upper surface 1a is a pressed surface pressed by the first support tool 3. The components 2A, 2B, 2C, and 2D are disposed between the components 1A and 1B. The components 2A and 2B are disposed so as to line up in the Y-axis direction near the end portions of the components 1A and 1B on the positive side in the X-axis direction. The components 2C and 2D are disposed so as to line up in the Y-axis direction near the end portions of the components 1A and 1B on the negative side in the X-axis direction. The components 2A, 2B, 2C, and 2D have an upper surface 2a spreading out in parallel to the XY plane at a position separated from the mounting surface 50a on the positive side in the Z-axis direction. The upper surface 2a is a pressed surface pressed by the second support tool 4. The heights of the components 2A, 2B, 2C, and 2D with respect to the mounting surface 50a are lower than those of the components 1A and 1B, and thus the upper surface 2a is disposed at a position on the negative side in the Z-axis direction as compared with the upper surface 1a. It should be noted that the direction of extension, the shape, the positional relationship, and so on of each component are not particularly limited and can be appropriately changed as needed.

It should be noted that "mounted on the mounting surface" in the present specification does not mean only the state of being directly joined to the mounting surface 50a as in the case of the components 2A, 2B, 2C, and 2D but includes the state of being present on the upper side of the mounting surface 50a without being directly joined to the mounting surface 50a as in the case of the components 1A and 1B. In other words, the components 1A and 1B are upper cores that are components connected to lower cores disposed on a base member 51 on the lower side of the substrate 50. The components 1A and 1B are in a state where a foot portion extending downward is inserted in the through hole of the substrate 50. The component that is present on the upper side of the mounting surface 50a and needs to be pressed to the mounting surface 50a side as described above corresponds to "component" in the claims.

The substrate 50 is disposed so as to face the base member 51 (structure). The base member 51 is a member that spreads out in parallel to the XY plane on the negative side in the Z-axis direction with respect to the substrate 50. The base member 51 is provided with fixing portions 52A and 52B fixing the support tools 3 and 4. The fixing portions 52A and 52B are configured by bosses protruding from the upper surface of the base member 51 to the positive side in the Z-axis direction. The fixing portions 52A and 52B penetrate the substrate 50 and protrude to positions on the positive side in the Z-axis direction beyond the mounting surface 50a. The upper surfaces of the fixing portions 52A and 52B are disposed at positions on the positive side in the Z-axis direction as compared with the upper surface 1a of the components 1A and 1B. The fixing portions 52A and 52B are disposed so as to be separated from each other in the X-axis direction. The fixing portion 52A is disposed at a position on the positive side in the X-axis direction with respect to the components 2A and 2B. The fixing portion 52B is disposed at a position on the negative side in the X-axis direction with respect to the components 2C and 2D. The fixing portions 52A and 52B will be described in more detail later.

The first support tool 3 and the second support tool 4 are metal fittings used so that the components 1A, 1B, 2A, 2B, 2C, and 2D are pressed to the mounting surface 50a side and supported. Each of the support tools 3 and 4 is configured by sheet metal processing being performed on a metal plate. The support tools 3 and 4 press the components 1A, 1B, 2A, 2B, 2C, and 2D by being fixed to the same fixing portions 52A and 52B in a state of overlapping each other.

The first support tool 3 is a metal fitting that presses the components 1A and 1B. The first support tool 3 has a base portion 10 and pressing portions 11A, 11B, 11C, and 11D. The first support tool 3 presses the component 1A with the pressing portions 11A and 11B and presses the component 1B with the pressing portions 11C and 11D.

The base portion 10 is a flat plate-shaped part that spreads out in parallel to the XY plane. The base portion 10 has a rectangular shape having a longitudinal direction in the X-axis direction. Two penetrating portions 12A and 12B lining up in the X-axis direction are formed in the base portion 10. The penetrating portion 12A is a rectangular hole for allowing confirmation of the components 2A and 2B in a state of being pressed by the second support tool 4. The penetrating portion 12B is a rectangular hole for allowing confirmation of the components 2C and 2D in a state of being pressed by the second support tool 4. The penetrating portions 12A and 12B are formed over substantially the entire length of the base portion 10 in the Y-axis direction. The penetrating portion 12A is separated from the edge portion of the base portion 10 on the positive side in the X-axis direction to the negative side in the X-axis direction. The penetrating portion 12B is separated from the edge portion of the base portion 10 on the negative side in the X-axis direction to the positive side in the X-axis direction.

The penetrating portion 12A and the penetrating portion 12B are separated from each other at the middle position of the base portion 10. As a result, the base portion 10 has an extending portion 13 extending in the Y-axis direction at the middle position in the X-axis direction.

The base portion 10 has reinforcing portions 14 in the four edge portions of the base portion 10. The reinforcing portion 14 is a part that extends to the positive side in the Z-axis direction, which is a direction different from the pressing portions 11A, 11B, 11C, and 11D, and enhances the strength as the first support tool 3. The reinforcing portion 14 is configured by the four edge portions of the base portion 10 being bent to the positive side in the Z-axis direction and raised.

The pressing portions 11A and 11B are formed in the edge portion of the base portion 10 on the positive side in the Y-axis direction. The pressing portions 11A and 11B extend from the edge portion of the base portion 10 toward the positive side in the Y-axis direction. The pressing portion 11B is disposed at a position near the end portion of the base portion 10 on the negative side in the X-axis direction. The pressing portion 11A is disposed at a position separated from the pressing portion 11B to the positive side in the X-axis direction and near the middle position of the base portion 10 in the X-axis direction. The pressing portions 11A and 11B extend from the upper end portion of the reinforcing portion 14 in a state of being inclined toward the positive side in the Y-axis direction and toward the negative side in the Z-axis direction. In addition, the pressing portions 11A and 11B are formed in a substantially triangular shape so as to taper toward the tip side. With such a configuration, the pressing portion 11A presses the region near the end portion of the upper surface 1a of the component 1A on the positive side in the X-axis direction in the tip portion of the pressing portion 11A. The pressing portion 11B presses the region near the end portion of the upper surface 1a of the component 1A on the negative side in the X-axis direction in the tip portion of the pressing portion 11B. It should be noted that the tip portions of the pressing portions 11A and 11B are bent so as to be inclined upward such that the upper surface 1a is easily pressed.

The pressing portions 11C and 11D are formed in the edge portion of the base portion 10 on the negative side in the Y-axis direction. The pressing portions 11C and 11D extend from the edge portion of the base portion 10 toward the negative side in the Y-axis direction. The pressing portion 11D is disposed at a position near the end portion of the base portion 10 on the negative side in the X-axis direction. The pressing portion 11C is disposed at a position separated from the pressing portion 11D to the positive side in the X-axis direction and near the end portion of the base portion 10 on the positive side in the X-axis direction. The pressing portions 11C and 11D extend from the upper end portion of the reinforcing portion 14 in a state of being inclined toward the negative side in the Y-axis direction and toward the negative side in the Z-axis direction. In addition, the pressing portions 11C and 11D are formed in a substantially triangular shape so as to taper toward the tip side. With such a configuration, the pressing portion 11C presses the region near the end portion of the upper surface 1a of the component 1B on the positive side in the X-axis direction in the tip portion of the pressing portion 11C. The pressing portion 11D presses the region near the end portion of the upper surface 1a of the component 1A on the negative side in the X-axis direction in the tip portion of the pressing portion 11D. It should be noted that the tip portions of the pressing portions 11C and 11D are bent so as to be inclined upward such that the upper surface 1a is easily pressed.

The second support tool 4 is a metal fitting that presses the components 2A, 2B, 2C, and 2D. The second support tool 4 has a base portion 20 and pressing portions 21A, 21B, 21C, and 21D. The second support tool 4 presses the component 2A with the pressing portion 21A, presses the component 2B with the pressing portion 21B, presses the component 2C with the pressing portion 21C, and presses the component 2D with the pressing portion 21D. When the second support tool 4 overlaps the first support tool 3, the second support tool 4 is disposed below the first support tool 3, that is, on the negative side in the Z-axis direction.

The base portion 20 is a flat plate-shaped part that spreads out in parallel to the XY plane. The base portion 20 has a rectangular shape having a longitudinal direction in the X-axis direction. The outer shape of the base portion 20 is substantially the same as the outer shape of the base portion 10 when viewed from the Z-axis direction. Two penetrating portions 22A and 22B lining up in the X-axis direction are formed in the base portion 20. The penetrating portion 22A is a rectangular hole for allowing confirmation of the components 2A and 2B in a state of being pressed by the second support tool 4. The penetrating portion 22B is a rectangular hole for allowing confirmation of the components 2C and 2D in a state of being pressed by the second support tool 4. The penetrating portions 22A and 22B are formed over substantially the entire length of the base portion 10 in the Y-axis direction. The penetrating portion 22A is separated from the edge portion of the base portion 20 on the positive side in the X-axis direction to the negative side in the X-axis direction. The penetrating portion 22B is separated from the edge portion of the base portion 20 on the negative side in the X-axis direction to the positive side in the X-axis direction. The penetrating portion 22A and the penetrating portion 22B are separated from each other at the middle position of the base portion 20. As a result, the base portion 20 has an extending portion 23 extending in the Y-axis direction at the middle position in the X-axis direction. The penetrating portions 22A and 22B are configured at positions and in shapes communicating with the penetrating portions 12A and 12B when the support tools 3 and 4 overlap each other. In addition, the extending portion 23 and the extending portion 13 are disposed so as to overlap each other (see FIG. 1).

In the example illustrated in the drawings, the base portion 20 has reinforcing portions 24 in the edge portions on the positive and negative sides in the Y-axis direction. The reinforcing portion 24 is a part that extends to the positive side in the Z-axis direction, which is a direction different from the pressing portions 21A, 21B, 21C, and 21D, and enhances the strength as the second support tool 4. The reinforcing portion 24 is configured by the edge portions of the base portion 20 on both sides in the Y-axis direction being bent to the positive side in the Z-axis direction and raised. The reinforcing portion 24 is disposed at a position facing the reinforcing portion 14 from the outside. Alternatively, the reinforcing portion 24 may be formed in the four edge portions of the base portion 20 as in the case of the reinforcing portion 14 of the base portion 10. Conversely, the reinforcing portion 14 of the base portion 10 may also be provided only at a part of the edge portion as in the case of the reinforcing portion 24 of the base portion 20.

The pressing portions 21A and 21B are formed in the edge portion of the extending portion 23 on the positive side in the X-axis direction. The pressing portions 21A and 21B extend from the edge portion of the extending portion 23 toward the positive side in the X-axis direction. The pressing portion 21A is disposed on the positive side in the Y-axis direction, and the pressing portion 21B is disposed on the negative side in the Y-axis direction. The pressing portions 21A and 21B extend from the edge portion of the extending portion 13 in a state of being inclined toward the positive side in the X-axis direction and toward the negative side in the Z-axis direction. In addition, the pressing portions 21A and 21B are formed in a substantially triangular shape so as to taper toward the tip side. With such a configuration, the pressing portion 21A presses the upper surface 2a of the component 2A in the tip portion of the pressing portion 21A. The pressing portion 21B presses the upper surface 2a of the component 2B in the tip portion of the pressing portion 21B. It should be noted that the tip portions of the pressing portions 21A and 21B are bent so as to be inclined upward such that the upper surface 2a is easily pressed.

The pressing portions 21C and 21D are formed in the edge portion of the extending portion 23 on the negative side in the X-axis direction. The pressing portions 21C and 21D extend from the edge portion of the extending portion 23 toward the negative side in the X-axis direction. The pressing portion 21A is disposed on the positive side in the Y-axis direction, and the pressing portion 21B is disposed on the negative side in the Y-axis direction. The pressing portions 21C and 21D extend from the edge portion of the extending portion 23 in a state of being inclined toward the negative side in the X-axis direction and toward the negative side in the Z-axis direction. In addition, the pressing portions 21C and 21D are formed in a substantially triangular shape so as to taper toward the tip side. With such a configuration, the pressing portion 21C presses the upper surface 2a of the component 2C in the tip portion of the pressing portion 21C. The pressing portion 21D presses the upper surface 2a of the component 2D in the tip portion of the pressing portion 21D. It should be noted that the tip portions of the pressing portions 21C and 21D are bent so as to be inclined upward such that the upper surface 2a is easily pressed.

It should be noted that the tip portions of the pressing portions 21A and 21B are disposed in the regions inside the four edge portions of the penetrating portions 12A and 22A in a plan view seen from the positive side toward the negative side in the Z-axis direction. As a result, the tip portions of the pressing portions 21A and 21B are in a state of being visibly exposed via the penetrating portions 12A and 22A in the plan view. In addition, the tip portions of the pressing portions 21C and 21D are disposed in the regions inside the four edge portions of the penetrating portions 12B and 22B in the plan view seen from the positive side toward the negative side in the Z-axis direction. As a result, the tip portions of the pressing portions 21C and 21D are in a state of being visibly exposed via the penetrating portions 12B and 22B in the plan view.

Here, the components 1A and 1B are heavy and tall components and are components that need to be directly pressed against the base member 51 for heat dissipation. On the other hand, the components 2A, 2B, 2C, and 2D are short components surface-mounted on the substrate 50 and are components that need to be pressed against the base member 51 together with the substrate 50 for heat dissipation. Accordingly, the pressing forces required for the components 1A and 1B and the components 2A, 2B, 2C, and 2D are different from each other. In addition, when the component is pressed, the component has to be pressed with an elastic force within a predetermined range. In a case where the components 1A and 1B and the components 2A, 2B, 2C, and 2D are to be pressed with one integrally formed support tool, the elastic force of the pressing portion has to be within the range determined for each component, but the problem arises that it is very difficult to form such a support tool with a single plate-shaped material (in which the plate thickness is constant and the material is the same). Accordingly, in the present embodiment, the first support tool 3 pressing the components 1A and 1B and the support tool 4 pressing the components 2A, 2B, 2C, and 2D are separated as separate members. In addition, the first support tool 3 and the second support tool 4 may be made of different materials. It should be noted that the different materials refer to plate materials different in plate thickness from each other and plate materials different in material from each other. Accordingly, at least one of the plate thickness and the material is different between the material constituting the first support tool 3 and the material constituting the second support tool 4. A material capable of exerting an elastic force within a predetermined range when the components 1A and 1B are pressed is used as the material of the first support tool 3. A material capable of exerting an elastic force within a predetermined range when the components 2A, 2B, 2C, and 2D are pressed is used as the material of the second support tool 4.

Next, fixed structures 70A and 70B of the support tools 3 and 4 will be described. The support tools 3 and 4 in a state of overlapping each other are fixed to the same fixing portion 52A in the region on the positive side in the X-axis direction and are positioned by the same positioning protrusion 53A. In addition, the support tools 3 and 4 in a state of overlapping each other are fixed to the same fixing portion 52B in the region on the negative side in the X-axis direction and are positioned by the same positioning protrusion 53B. In other words, the support tools 3 and 4 have the fixed structures 70A and 70B fixed to the same fixing portions 52A and 52B provided on the base member 51 in a state of overlapping each other.

Specifically, fastening holes 52a for fastening bolts are formed in the upper surfaces of the fixing portions 52A and 52B. In addition, the positioning protrusions 53A and 53B protruding to the positive side in the Z-axis direction are formed on the upper surfaces of the fixing portions 52A and 52B, respectively. The positioning protrusion 53A is disposed on the positive side in the Y-axis direction with respect to the fastening hole 52a of the fixing portion 52A. The positioning protrusion 53B is disposed on the negative side in the Y-axis direction with respect to the fastening hole 52a of the fixing portion 52B.

As illustrated in FIG. 2, the first support tool 3 has a bolt insertion hole 16A formed in the region of the end portion of the base portion 10 on the positive side in the X-axis direction. The second support tool 4 has a bolt insertion hole 26A formed in the region of the end portion of the base portion 20 on the positive side in the X-axis direction. The bolt insertion holes 16A and 26A are formed at the same position and in the same shape so as to communicate with each other when the support tools 3 and 4 overlap each other. As a result, the support tools 3 and 4 are fixed to the fixing portion 52A by bolts 60A being fastened to the fastening holes 52a with the bolts 60A inserted in the bolt insertion holes 16A and 26A. In this manner, the fixed structure 70A with respect to the fixing portion 52A is configured by the bolt insertion holes 16A and 26A.

The first support tool 3 has a positioning hole 17A formed in the region of the end portion of the base portion 10 on the positive side in the X-axis direction. The second support tool 4 has a positioning hole 27A formed in the region of the end portion of the base portion 20 on the positive side in the X-axis direction. The positioning holes 17A and 27A are formed at the same position and in the same shape so as to communicate with each other when the support tools 3 and 4 overlap each other. As a result, the support tools 3 and 4 are positioned with respect to the fixing portion 52A by the positioning protrusion 53A being inserted into the positioning holes 17A and 27A.

The first support tool 3 has a bolt insertion hole 16B formed in the region of the end portion of the base portion 10 on the negative side in the X-axis direction. The second support tool 4 has a bolt insertion hole 26B formed in the region of the end portion of the base portion 20 on the negative side in the X-axis direction. The bolt insertion holes 16B and 26B are formed at the same position and in the same shape so as to communicate with each other when the support tools 3 and 4 overlap each other. As a result, the support tools 3 and 4 are fixed to the fixing portion 52B by bolts 60B being fastened to the fastening holes 52a with the bolts 60B inserted in the bolt insertion holes 16B and 26B. In this manner, the fixed structure 70B with respect to the fixing portion 52B is configured by the bolt insertion holes 16B and 26B.

The first support tool 3 has a positioning hole 17B formed in the region of the end portion of the base portion 10 on the negative side in the X-axis direction. The second support tool 4 has a positioning hole 27B formed in the region of the end portion of the base portion 20 on the negative side in the X-axis direction. The positioning holes 17B and 27B are formed at the same position and in the same shape so as to communicate with each other when the support tools 3 and 4 overlap each other. As a result, the support tools 3 and 4 are positioned with respect to the fixing portion 52B by the positioning protrusion 53B being inserted into the positioning holes 17B and 27B.

In a state where the support tools 3 and 4 overlap each other and are fixed to the fixing portions 52A and 52B as described above, the surface of the base portion 10 on the negative side in the Z-axis direction and the surface of the base portion 20 on the positive side in the Z-axis direction come into contact with each other. Accordingly, the thickness of the base member in the base end portion is increased for each of the pressing portions 11A, 11B, 11C, 11D, 21A, 21B, 21C, and 21D. Specifically, the extending portion 13 and the extending portion 23 have a structure in which the extending portion 13 and the extending portion 23 extend in the Y-axis direction in a state where the extending portion 13 and the extending portion 23 overlap each other and are in contact with each other. At the part in particular, the extending portion 23 tends to float upward when the pressing portions 21A, 21B, 21C, and 21D perform pressing. On the other hand, the extending portion 13 is capable of receiving and suppressing the floating of the extending portion 23. The base portions 10 and 20 overlap each other and come into contact with each other near the respective fixing portions 52A and 52B as well. As a result, the support tools 3 and 4 are capable of reinforcing the strength at a time of pressing the components 1A, 1B, 2A, 2B, 2C, and 2D by mutual overlapping.

Next, the actions and effects of the support structure 100 according to the present embodiment will be described.

The support structure 100 according to the present embodiment includes the first support tool 3 and the second support tool 4 used so that the components 1A, 1B, 2A, 2B, 2C, and 2D are pressed to the mounting surface 50a side and supported. In addition, the first support tool 3 and the second support tool 4 are fixed to the same fixing portions 52A and 52B. As a result, it is possible to collectively fix the first support tool 3 and the second support tool 4 with respect to the fixing portions 52A and 52B even without increasing the weight by using, for example, a large cover different from the support tools 3 and 4. As a result, it is possible to suppress an increase in weight while improving the workability at a time of fixing the support tools 3 and 4.

The set 110 of the first support tool 3 and the second support tool 4 has the plurality of pressing portions 11A, 11B, 21A, 21B, 21C, and 21D pressing the plurality of components 1A, 1B, 2A, 2B, 2C, and 2D. As a result, it is possible to collectively press the plurality of components 1A, 1B, 2A, 2B, 2C, and 2D by fixing the first support tool 3 and the second support tool 4 to the fixing portions 52A and 52B.

The first support tool 3 has the pressing portions 11A and 11B pressing the components 1A and 1B and the reinforcing portion 14 extending in a direction different from the pressing portions 11A and 11B and enhancing the strength as the support tool. As a result, the pressing force at a time when the pressing portions 11A and 11B press the components 1A and 1B can be improved. The second support tool 4 has the pressing portions 21A, 21B, 21C, and 21D pressing the components 2A, 2B, 2C, and 2D and the reinforcing portion 24 extending in a direction different from the pressing portions 21A, 21B, 21C, and 21D and enhancing the strength as the support tool. As a result, the pressing force at a time when the pressing portions 21A, 21B, 21C, and 21D press the components 2A, 2B, 2C, and 2D can be improved.

The support structure 100 further includes the positioning protrusions 53A and 53B provided on the structure and positioning the first support tool 3 and the second support tool 4, and the first support tool 3 and the second support tool 4 have the positioning holes 17A, 17B, 27A, and 27B into which the same positioning protrusions 53A and 53B are inserted, respectively. As a result, the first support tool 3 and the second support tool 4 can be collectively positioned.

The penetrating portions 12A, 12B, 22A, and 22B allowing confirmation of the components 2A, 2B, 2C, and 2D that are pressed are formed in the first support tool 3 and the second support tool 4. In this case, it is possible to confirm the state of pressing of the components 2A, 2B, 2C, and 2D, even in a structure in which the components 2A, 2B, 2C, and 2D are hidden on the lower sides of the base portions 10 and 20, by combining the plurality of support tools 3 and 4.

The first support tool 3 and the second support tool 4 reinforce the strength at a time of pressing the components 1A, 1B, 2A, 2B, 2C, and 2D by mutual overlapping. As a result, the first support tool 3 and the second support tool 4 can be overlapped and collectively fixed by the fixing portions 52A and 52B and the pressing forces of the components 1A, 1B, 2A, 2B, 2C, and 2D can be improved at the same time.

The first support tool 3 and the second support tool 4 are made of different materials. Even in a case where, for example, the pressing forces required for the components 1A and 1B pressed by the first support tool 3 and the components 2A, 2B, 2C, and 2D pressed by the second support tool 4 are different from each other, it is possible to easily obtain a pressing portion having an elastic force corresponding to the required pressing force simply by using different materials for the first support tool 3 and the second support tool 4.

The support tool set 110 is the support tool set 110 pressing the components 1A, 1B, 2A, 2B, 2C, and 2D mounted on the mounting surface 50a of the structure to the mounting surface 50a side and supporting the components 1A, 1B, 2A, 2B, 2C, and 2D and includes the first support tool 3 and the second support tool 4 used so that the components 1A, 1B, 2A, 2B, 2C, and 2D are pressed to the mounting surface 50a side and supported. The first support tool 3 and the second support tool 4 have the fixed structures 70A and 70B fixed to the same fixing portions 52A and 52B provided on the structure in a state of overlapping each other.

With the support tool set 110, it is possible to obtain the same actions and effects as the support structure 100 described above.

The present disclosure is not limited to the embodiment described above.

The shape of the support tool is not limited to the embodiment described above. For example, the shape of the base portion and the directions and number of the pressing portions may be appropriately changed depending on, for example, the number or disposition of components to be pressed.

For example, in the embodiment described above, the components 1A and 1B extend in the X-axis direction, the pressing portions 11A and 11B lining up in the X-axis direction press the component 1A, and the pressing portions 11C and 11D press the component 1B. Alternatively, the components 1A and 1B may be configured to extend in the Y-axis direction. In this case, the pressing portions 11A and 11C facing each other across the base portion 10 in the Y-axis direction may press the component 1A and the pressing portions 11B and 11D may press the component 1B.

In addition, in the embodiment described above, the tip portions of the pressing portions 21A and 21B and the tip portions of the pressing portions 21C and 21D extend toward opposite sides. Alternatively, the tip portions of the pressing portions 21A and 21B and the tip portions of the pressing portions 21C and 21D may extend so as to approach each other. In addition, although the pressing portions 21A, 21B, 21C, and 21D extend along the longitudinal direction (X-axis direction) of the base portion 20, the pressing portions 21A, 21B, 21C, and 21D may extend along the lateral direction (Y-axis direction). In this case as well, the pressing portions 21A and 21B and the pressing portions 21C and 21D may extend such that the respective tip portions are directed toward opposite sides or may extend such that the respective tip portions approach each other.

In addition, in the embodiment described above, the pressing portions 21A, 21B, 21C, and 21D are formed so as not to protrude to the outside from the edge portion of the base portion 20 when viewed from above. Alternatively, the pressing portions 21A, 21B, 21C, and 21D may be formed so as to protrude to the outside from the edge portion of the base portion 20 depending on the positions of the components 2A, 2B, 2C, and 2D. For example, the pressing portions 21A and 21B may extend to the outside from one long side of the base portion 20 and the pressing portions 21C and 21D may extend to the outside from the other long side of the base portion 20 as in the case of the first support tool 3.

It should be noted that each component and each pressing portion are configured not to interfere with each other in a case where the structure is changed as described above.

In the embodiment described above, the support tools 3 and 4 are fixed by the fixing portions 52A and 52B in both end portions in the longitudinal direction. Alternatively, the number of the fixing portions may be further increased. For example, the support tools 3 and 4 may be fixed to the fixing portion near the middle position in the longitudinal direction.

Figure 3:
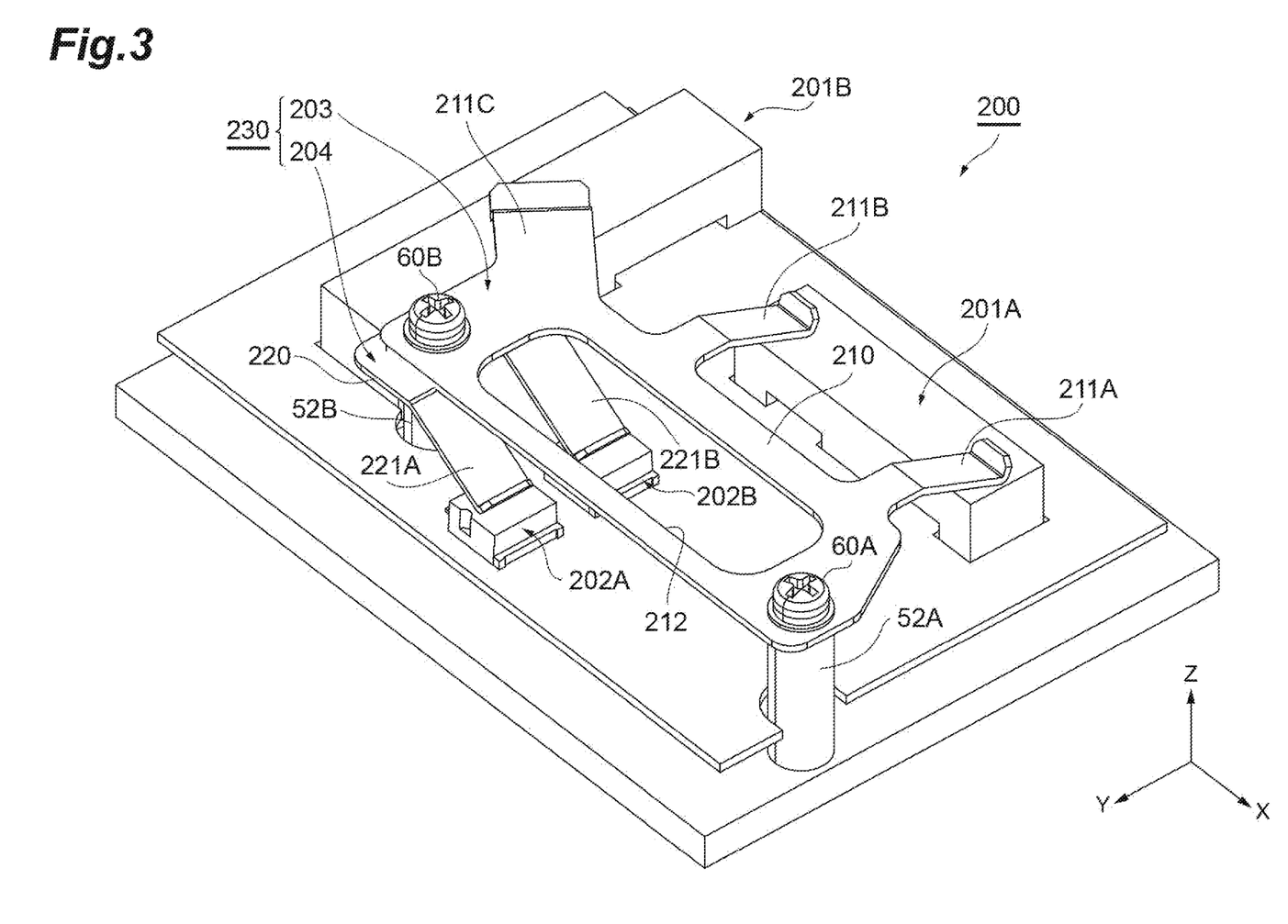
FIG. 3 is a perspective view illustrating a support structure according to a modification example.
Figure 4:
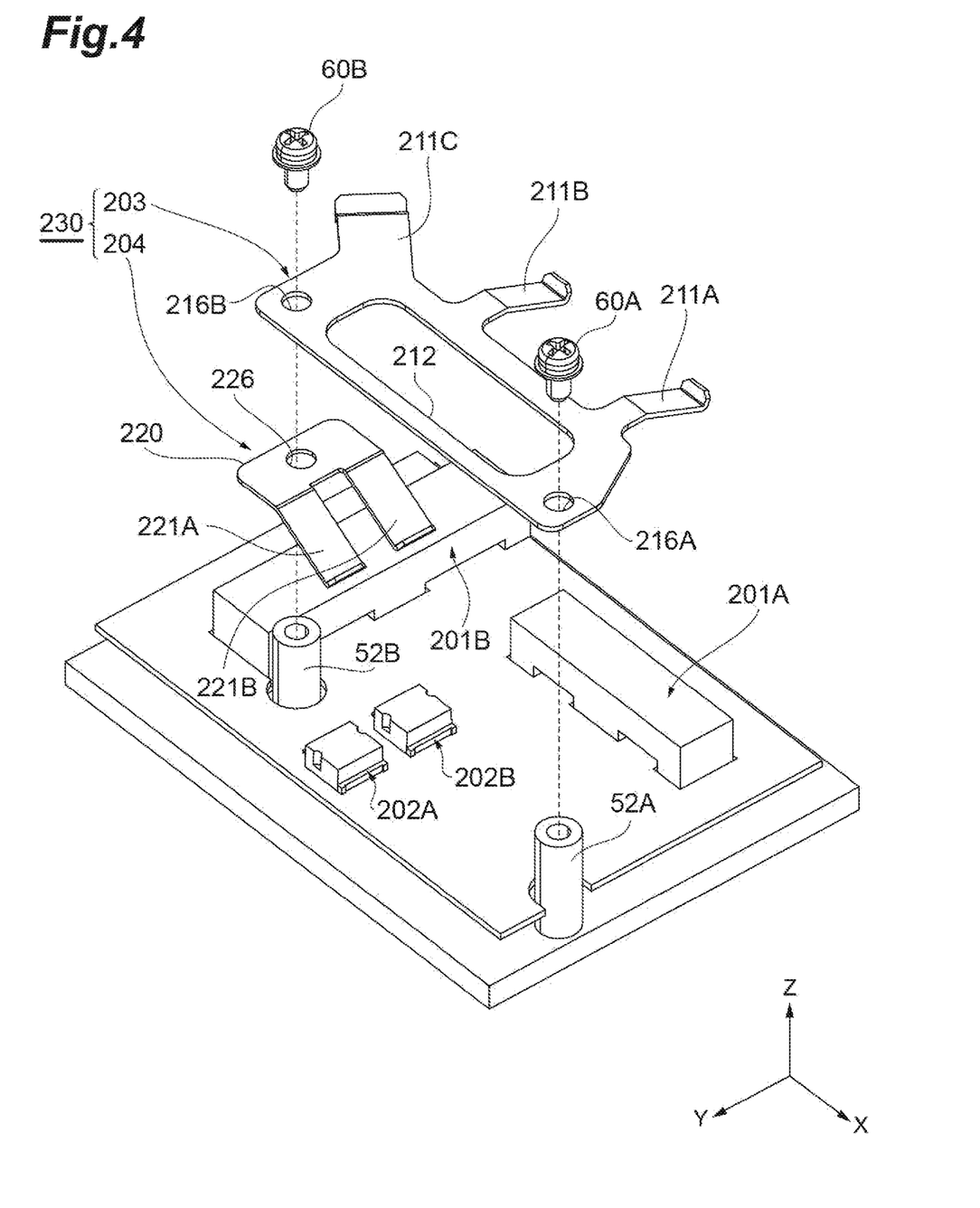
FIG. 4 is a developed perspective view of the support structure of FIG. 3.

In addition, for example, a support structure 200 according to the modification example illustrated in FIGS. 3 and 4 may be adopted. The support structure 200 includes a first support tool 203 and a second support tool 204 as a support tool set 230. In the support structure 200, components 201A and 201B disposed such that the longitudinal directions of the components 201A and 201B are orthogonal to each other and small components 202A and 202B are disposed on a substrate.

The first support tool 203 includes a base portion 210, pressing portions 211A and 211B pressing the component 201A, and a pressing portion 211C pressing the component 201B. The base portion 210 has bolt insertion holes 216A and 216B fixed to the fixing portions 52A and 52B via the bolts 60A and 60B, respectively. In addition, the base portion 210 has a penetrating portion 212 allowing confirmation of the components 202A and 202B.

The second support tool 204 includes a base portion 220 and pressing portions 221A and 221B pressing the components 202A and 202B. The base portion 220 has a bolt insertion hole 226 fixed to the fixing portion 52B via the bolt 60B. The base portion 220 overlaps the vicinity of the end portion of the base portion 210 on the negative side in the X-axis direction. In addition, the first support tool 203 and the second support tool 204 are fixed to the same fixing portion 52B.

In addition, the support structure may include three or more support tools. In other words, the number of support tools may be increased in accordance with the number of components.

In addition, in the embodiment and modification example described above, both the first support tool and the second support tool have a pressing portion. Alternatively, a structure may be adopted in which one support tool has a pressing portion and the other support tool does not have a pressing portion. In this case, the other support tool has a function of reinforcing one support tool to improve the pressing force. For example, in collectively pressing multiple components with one support tool, it is necessary to increase the plate thickness of the sheet metal in order to improve the strength of the support tool. In this case, the thickness of the support tool as a whole increases and the weight of the entire support tool including the pressing portion increases. On the other hand, in the case of the structure in which the other support tool provides the reinforcement, it is possible to reinforce only the required point of the base portion without increasing the thickness of the pressing portion. As a result, an increase in weight can be suppressed.

In addition, in the embodiment described above, a configuration has been exemplified in which the positioning protrusions 53A and 53B as positioning structures are provided on the structure (here, the fixing portions 52A and 52B) and the positioning protrusions 53A and 53B are inserted into the positioning holes 17A, 17B, 27A, and 27B of the support tools 3 and 4. However, the positioning structure is not limited to the embodiment described above. For example, the first support tool 3 may be provided with a protrusion and the fixing portions 52A and 52B may be provided with recess portions. In addition, the shapes of the positioning holes 17A, 17B, 27A, and 27B are not particularly limited and may be formed in a slit shape.

Embodiment 1. A support structure supporting a component mounted on a mounting surface of a structure by pressing the component to the mounting surface side, the support structure comprising:

a first support tool and a second support tool used so that the component is pressed to the mounting surface side and supported; and a fixing portion provided on the structure and fixing the first support tool and the second support tool, wherein the first support tool and the second support tool are fixed to the same fixing portion.

Embodiment 2. The support structure according to embodiment 1, wherein a set of the first support tool and the second support tool has a plurality of pressing portions pressing a plurality of the components.

Embodiment 3. The support structure according to embodiment 1 or 2, wherein at least one of the first support tool and the second support tool has:

a pressing portion pressing the component; and a reinforcing portion extending in a direction different from the pressing portion and enhancing strength as a support tool.

Embodiment 4. The support structure according to any one of embodiments 1 to 3, further comprising a positioning protrusion provided on the structure and positioning the first support tool and the second support tool, wherein the first support tool and the second support tool respectively have positioning holes into which the same positioning protrusion is inserted.

Embodiment 5. The support structure according to any one of embodiments 1 to 4, wherein a penetrating portion allowing confirmation of the component in a pressed state is formed in at least one of the first support tool and the second support tool.

Embodiment 6. The support structure according to any one of embodiments 1 to 5, wherein the first support tool and the second support tool reinforce strength at a time when the component is pressed by overlapping each other.

Embodiment 7. The support structure according to any one of embodiments 1 to 6, wherein the first support tool and the second support tool are made of different materials.

Embodiment 8. A support tool set supporting a component mounted on a mounting surface of a structure by pressing the component to the mounting surface side, the support tool set comprising a first support tool and a second support tool used so that the component is pressed to the mounting surface side and supported, wherein the first support tool and the second support tool have fixed structures fixed to the same fixing portion provided on the structure in a state of overlapping each other.

REFERENCE SIGNS LIST 1A, 1B, 2A, 2B, 2C, 2D, 201A, 201B, 202A, 202B: component, 3, 203: first support tool, 4, 204: second support tool, 11A, 11B, 11C, 11D, 21A, 21B, 21C, 21D, 211A, 211B, 211C, 221A, 221B: pressing portion, 12A, 12B, 22A, 22B, 212: penetrating portion, 14, 24: reinforcing portion, 17A, 17B, 27A, 27B: positioning hole, 50: substrate (structure), 51: base member (structure), 52A, 52B: fixing portion, 53A, 53B: positioning protrusion, 70A, 70B: fixed structure, 100, 200: support structure, 110, 230: support tool set.

What is claimed is:

1. A support structure configured to support a component mounted on a mounting surface of a structure by pressing the component toward the mounting surface, the support structure comprising:

a first support tool and a second support tool configured such that the component is pressed toward the mounting surface and supported by the first support tool and the second support tool; and a fixing portion (i) fixed relative to a base supporting the structure having the mounting surface and (ii) including a screw boss, wherein:

the first support tool has a first bolt insertion hole;

the second support tool has a second bolt insertion hole; and the first support tool and the second support tool are configured to be fixed to the fixing portion by a screw (i) passing through the first bolt insertion hole and the second bolt insertion hole when the first bolt insertion hole and the second bolt insertion hole are axially aligned and (ii) engaging the screw boss.

2. The support structure according to claim 1, wherein the first support tool and the second support tool in combination comprise a set of support tools having a plurality of pressing portions configured to press a plurality of the components.

3. The support structure according to claim 1, wherein at least one of the first support tool and the second support tool has:

a pressing portion configured to press the component; and a reinforcing portion extending in a direction different from the pressing portion and configured to enhance strength of the at least one of the first support tool and the second support tool.

4. The support structure according to claim 1, wherein the first support tool and the second support tool each have a positioning hole configured to receive a same positioning protrusion of the structure.

5. The support structure according to claim 1, wherein a penetrating portion configured to allow confirmation of the component in a pressed state is in at least one of the first support tool and the second support tool.

6. The support structure according to claim 1, wherein the first support tool and the second support tool are overlapping when fixed to the fixing portion.

7. The support structure according to claim 1, wherein the first support tool and the second support tool are made of different materials.

8. A support tool set configured to support a component mounted on a mounting surface of a structure by pressing the component toward the mounting surface, the support tool set comprising:

a first support tool and a second support tool configured such that the component is pressed toward the mounting surface side and supported by the first support tool and the second support tool, wherein:

the first support tool has a first bolt insertion hole;

the second support tool has a second bolt insertion hole; and the first support tool and the second support tool are configured to be fixed to a same fixing portion of a base supporting the structure having the mounting surface by a screw (i) received through the first bolt insertion hole and the second bolt insertion hole and (ii) that engages the same fixing portion.

* * * * *